(12) United States Patent
Harada et al.

(10) Patent No.: US 12,424,383 B2
(45) Date of Patent: Sep. 23, 2025

(54) SEMICONDUCTOR DEVICE

(71) Applicant: Murata Manufacturing Co., Ltd., Nagaokakyo (JP)

(72) Inventors: Masatomi Harada, Nagaokakyo (JP); Korekiyo Ito, Nagaokakyo (JP); Takeshi Kagawa, Nagaokakyo (JP); Yuta Imamura, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 120 days.

(21) Appl. No.: 18/497,066

(22) Filed: Oct. 30, 2023

(65) Prior Publication Data

US 2024/0062958 A1 Feb. 22, 2024

Related U.S. Application Data

(63) Continuation of application No. PCT/JP2022/019619, filed on May 9, 2022.

(30) Foreign Application Priority Data

May 10, 2021 (JP) ................................ 2021-079848

(51) Int. Cl.
*H01G 4/005* (2006.01)
*H01G 4/224* (2006.01)
*H01G 4/33* (2006.01)

(52) U.S. Cl.
CPC ............. *H01G 4/005* (2013.01); *H01G 4/224* (2013.01); *H01G 4/33* (2013.01)

(58) Field of Classification Search
CPC ........... H01G 4/33; H01G 4/224; H01G 4/005
See application file for complete search history.

(56) References Cited

U.S. PATENT DOCUMENTS 11,101,072 B2  8/2021  Harada et al.
2003/0119211 A1*  6/2003  Summerfelt ...... H01L 21/31122
  257/E21.664

(Continued)

FOREIGN PATENT DOCUMENTS

JP  H0547586 A  2/1993
JP  2003197463 A  7/2003

(Continued)

OTHER PUBLICATIONS

International Search Report in PCT/JP2022/019619, mailed Jul. 19, 2022, 4 pages.

*Primary Examiner* — David M Sinclair
(74) *Attorney, Agent, or Firm* — ArentFox Schiff LLP

(57) ABSTRACT

A capacitor that includes: a substrate; a first electrode layer on the substrate, the first electrode layer including a first principal surface facing the substrate, and a second principal surface opposite the first principal surface; a dielectric film on the first electrode layer and covering an end portion of the first electrode layer; a second electrode layer on the dielectric film, the second electrode layer including a third principal surface facing the dielectric film, a fourth principal surface opposite the third principal surface, and a side surface joining the third principal surface and the fourth principal surface, wherein at least part of the side surface of the second electrode layer has a tapered shape which is inclined inward from the third principal surface to the fourth principal surface.

15 Claims, 6 Drawing Sheets

(56) References Cited

U.S. PATENT DOCUMENTS

| | | |
|---|---|---|
| 2003/0136997 A1 | 7/2003 | Shioga et al. |
| 2004/0195567 A1* | 10/2004 | Ogino .................. H10D 84/212 |
| | | 257/E27.048 |
| 2007/0065994 A1 | 3/2007 | Chen |
| 2007/0201182 A1* | 8/2007 | Nakayama ............... H01G 4/33 |
| | | 361/311 |
| 2008/0145996 A1 | 6/2008 | Nomura et al. |
| 2008/0164563 A1 | 7/2008 | Nomura et al. |
| 2010/0178878 A1 | 7/2010 | Kurioka |
| 2017/0345577 A1 | 11/2017 | Nakaiso et al. |
| 2018/0102219 A1* | 4/2018 | Kumagae ............. H01G 4/1227 |
| 2019/0074348 A1 | 3/2019 | Ishida et al. |
| 2019/0122820 A1 | 4/2019 | Harada et al. |
| 2022/0302246 A1* | 9/2022 | Igarashi ................. H10D 1/692 |

FOREIGN PATENT DOCUMENTS

| | | |
|---|---|---|
| JP | 2006196871 A | 7/2006 |
| JP | 2008153497 A | 7/2008 |
| JP | 2008-252011 A | 10/2008 |
| JP | 2008277520 A | 11/2008 |
| JP | 2009509355 A | 3/2009 |
| JP | 2020115587 A | 7/2020 |
| JP | 2020-202307 A | 12/2020 |
| WO | 2006117912 A1 | 11/2006 |
| WO | 2008149622 A1 | 12/2008 |
| WO | 2016136564 A1 | 9/2016 |
| WO | 2018008625 A1 | 1/2018 |
| WO | WO-2019026771 A1 * | 2/2019 |

* cited by examiner

SEMICONDUCTOR DEVICE

CROSS REFERENCE TO RELATED APPLICATIONS

The present application is a continuation of International application No. PCT/JP2022/019619, filed May 9, 2022, which claims priority to Japanese Patent Application No. 2021-079848, filed May 10, 2021, the entire contents of each of which are incorporated herein by reference.

TECHNICAL FIELD

The present invention relates to a semiconductor device.

BACKGROUND ART

An MIM (metal-insulator-metal) capacitor, for example, has been known as a typical capacitor element used in semiconductor integrated circuits. The MIM capacitor is a capacitor having a parallel flat plate structure in which an insulator is sandwiched between a lower electrode and an upper electrode.

Patent Document 1 discloses a capacitor component including a lower electrode formed on a substrate, a dielectric thin film formed on this lower electrode, an upper electrode formed on this dielectric thin film, an insulating layer formed on the substrate inclusive of the upper electrode, and a pair of electrode terminals connected to the respective electrodes and disposed such that end portions thereof are located on the same plane.

Patent Document 1: Japanese Unexamined Patent Application Publication No. Hei 5-47586

SUMMARY OF THE INVENTION

In the capacitor component (a capacitor) disclosed in Patent Document 1, the electrodes serving as outer electrodes protrude most. For this reason, in a case of mounting the semiconductor device such as the above-described capacitor onto a wiring board, a load will be applied to the outer electrodes that protrude most. Application of the load in a thickness direction of the semiconductor device via the outer electrodes may develop cracks at the dielectric film in case of application of an excessive load to the semiconductor device, and may cause a problem of a short circuit of the semiconductor device.

The present invention has been made in order to solve the aforementioned problem. An object of embodiments of the present invention is to provide a semiconductor device that suppresses the occurrence of cracks at a dielectric film when a load is applied to an outer electrode.

A semiconductor device of the present disclosure includes: a substrate; a first electrode layer on the substrate, the first electrode layer including a first principal surface facing the substrate, a second principal surface opposite the first principal surface, and a first side surface joining the first principal surface and the second principal surface; a dielectric film on the first electrode layer and covering an end portion of the first electrode layer; a second electrode layer on the dielectric film, the second electrode layer including a third principal surface facing the dielectric film, a fourth principal surface opposite the third principal surface, and a second side surface joining the third principal surface and the fourth principal surface, wherein at least part of the second side surface of the second electrode layer has a first tapered shape which is inclined inward from the third principal surface to the fourth principal surface; a moisture resistant film on the dielectric film and on the second electrode layer; a protecting layer on the moisture resistant film; and an outer electrode penetrating the protecting layer.

According to the present invention, it is possible to provide a semiconductor device that suppresses the occurrence of cracks at a dielectric film when a load is applied to an outer electrode.

BRIEF DESCRIPTION OF THE DRAWINGS

FIG. 4-1 is a graph plotting a relation between a taper angle $\theta_A$ and a stress at a point A.

FIG. 4-2 is a schematic diagram for explaining a method of measuring the taper angle $\theta_A$.

DETAILED DESCRIPTION OF THE PREFERRED EMBODIMENTS

A semiconductor device of the present invention will be described below.

However, the present invention is not limited to the following configurations, and appropriate modifications within a range not changing the gist of the present invention are applicable as appropriate. Note that a combination of two or more individual preferred configurations of the present invention to be described below is also encompassed by the present invention.

The respective embodiments to be described below are exemplary, and it is needless to say that partial replacement or combination of configurations demonstrated in different embodiments is possible. In a second embodiment and so on, explanations on items that are common to a first embodiment will be omitted and different features will only be discussed. In particular, the same operations and effects brought about by the same configurations will not be stated every time in each embodiment.

A simple expression of a "semiconductor device of the present invention" will be used in the following description when the respective embodiments need not be distinguished from one another. The semiconductor device of the present invention and shapes, layouts, and other features of respective constituents thereof are not limited to the illustrated examples.

Moreover, in the following description, a capacitor will be described as an embodiment of the semiconductor device of the present invention. The semiconductor device of the present invention may be the capacitor itself (that is, a capacitor element) or may be a device including the capacitor.

First Embodiment

In a capacitor according to a first embodiment of the present invention, a second electrode layer is formed from a single conductive layer.

Figure 1:
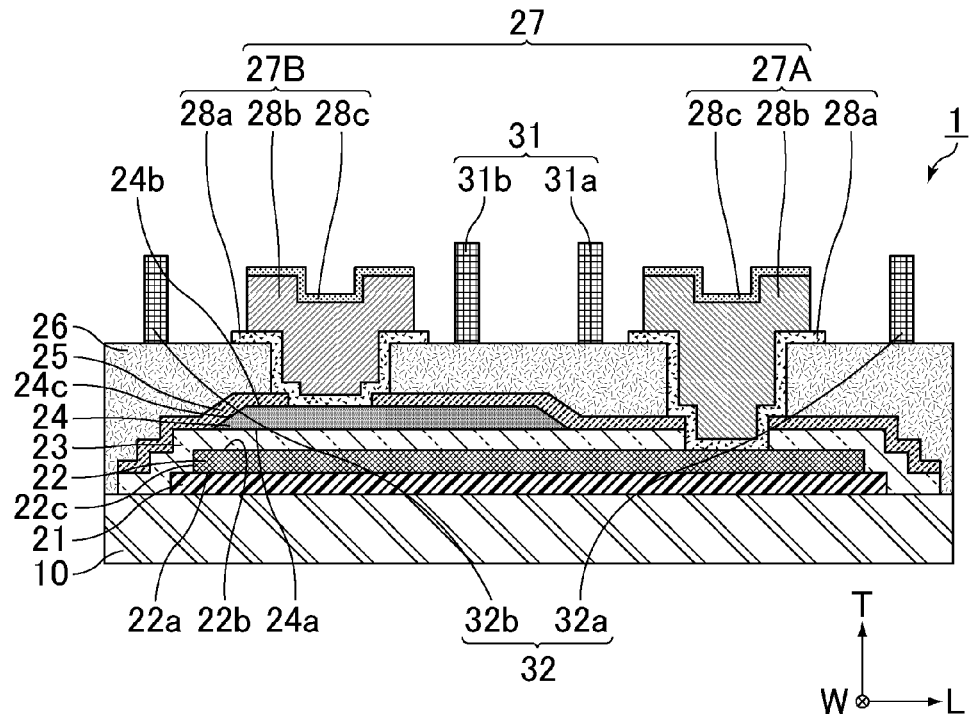
FIG. 1 is a cross-sectional view schematically illustrating an example of a capacitor according to a first embodiment of the present invention.
Figure 2:
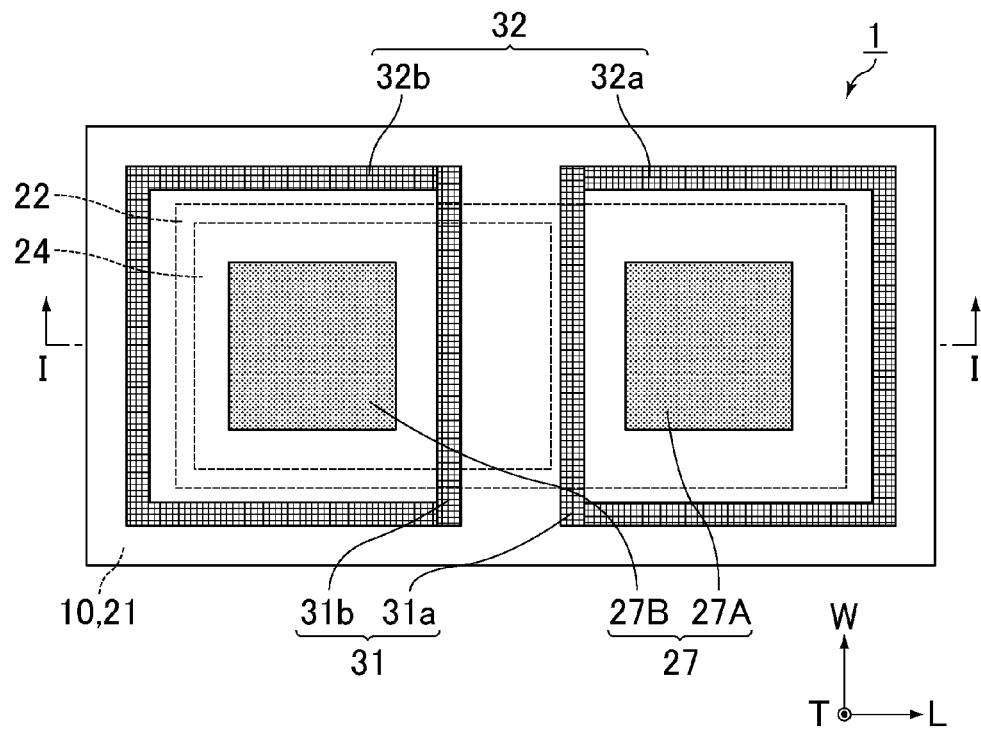
FIG. 2 is a plan view schematically illustrating the example of the capacitor according to the first embodiment of the present invention.

FIG. 1 is a cross-sectional view schematically illustrating an example of the capacitor according to the first embodiment of the present invention. FIG. 2 is a plan view schematically illustrating the example of the capacitor according to the first embodiment of the present invention. FIG. 1 is a cross-sectional view of the capacitor illustrated in FIG. 2, which is taken along the I-I line.

In the present specification, a length direction, a width direction, and a thickness direction of a capacitor (a semiconductor device) are determined as directions defined by an arrow L, an arrow W, and an arrow T, respectively as illustrated in FIGS. 1, 2, and the like. Here, the length direction L, the width direction W, and the thickness direction T are orthogonal to one another.

A capacitor 1 illustrated in FIGS. 1 and 2 includes a substrate 10, an insulating film 21 provided on the substrate 10, a first electrode layer 22 provided on the insulating film 21, a dielectric film 23 provided on the first electrode layer 22 and covering an end portion of the first electrode layer 22, a second electrode layer 24 provided on the dielectric film 23, a moisture resistant film 25 provided on the dielectric film 23 and on the second electrode layer 24, a protecting layer 26 provided on the moisture resistant film 25, and an outer electrode 27 penetrating the protecting layer 26. The outer electrode 27 includes a first outer electrode 27A connected to the first electrode layer 22 and a second outer electrode 27B connected to the second electrode layer 24. The first outer electrode 27A penetrates the protecting layer 26, the moisture resistant film 25, and the dielectric film 23 while the second outer electrode 27B penetrates the protecting layer 26 and the moisture resistant film 25.

Although not limited to a particular material, the substrate 10 is preferably a semiconductor substrate such as a silicon substrate and a gallium arsenide substrate, or an insulative substrate such as glass and alumina.

The insulating film 21 may be provided in such a way as to entirely cover one principal surface of the substrate 10 or to partially cover this principal surface. Nonetheless, the insulating film 21 needs to be larger than the first electrode layer 22 and to be provided in a region that overlaps the entire region of the first electrode layer 22. Here, the insulating film 21 need not be provided when the substrate 10 is the insulative substrate such as glass or alumina.

Although a material constituting the insulating film 21 is not limited to a particular material, examples of a preferred material include $SiO_2$, $SiN$, $Al_2O_3$, $HfO_2$, $Ta_2O_5$, $ZrO_2$, and the like.

The first electrode layer 22 is provided at a position located away from an end portion of the substrate 10. Specifically, the end portion of the first electrode layer 22 is located on an inner side relative to the end portion of the substrate 10. The first electrode layer 22 includes a first principal surface 22a on the substrate 10 side, a second principal surface 22b on the dielectric film 23 side, and a side surface 22c which joins the first principal surface 22a and the second principal surface 22b.

The first electrode layer 22 may have a structure formed from a single conductive layer, or a structure formed from multiple conductive layers laminated in a thickness direction (a direction indicated with an arrow T in FIGS. 1 and 2).

Although a material constituting the first electrode layer 22 is not limited to a particular material, examples of a preferred material include Cu, Ag, Au, Al, Ni, Cr, Ti, an alloy containing at least one of these metal elements, and the like.

The dielectric film 23 is provided in such a way as to cover the first electrode layer 22 at a portion except an opening. The dielectric film 23 is also provided on a surface of the insulating film 21 from the end portion of the first electrode layer 22 to an end portion of the insulating film 21. Specifically, the dielectric film 23 is provided in such a way as to cover the end portion of the first electrode layer 22. Moreover, the dielectric film 23 may also be formed on a surface of the substrate 10 from the end portion of the insulating film 21 to the end portion of the substrate 10. Specifically, the dielectric film 23 may be provided in such a way as to cover the end portion of the insulating film 21.

Although a material constituting the dielectric film 23 is not limited to a particular material, examples of a preferred material include an oxide and a nitride such as $SiO_2$, $SiN$, $Al_2O_3$, $HfO_2$, and $Ta_2O_5$.

The second electrode layer 24 is provided to be opposed to the first electrode layer 22 with the dielectric film 23 interposed therebetween. The second electrode layer 24 includes a first principal surface 24a on the dielectric film 23 side, a second principal surface 24b on the moisture resistant film 25 side, and a side surface 24c which joins the first principal surface 24a and the second principal surface 24b.

The second electrode layer 24 has a structure formed from a single conductive layer.

Although a material constituting the second electrode layer 24 is not limited to a particular material, preferable examples thereof include Cu, Ag, Au, Al, Ni, Cr, Ti, an alloy containing at least one of these metal elements, and the like.

Figure 3:
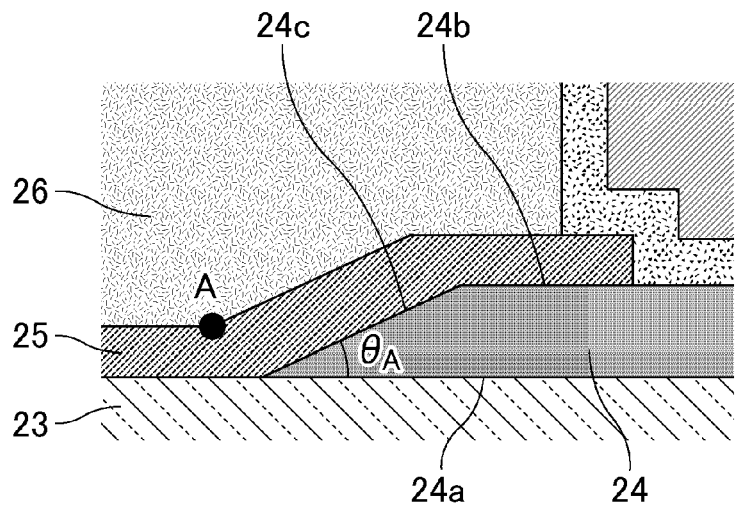
FIG. 3 is an enlarged cross-sectional view of a side surface of a second electrode layer constituting the capacitor illustrated in FIG. 1.

FIG. 3 is an enlarged cross-sectional view of the side surface of the second electrode layer constituting the capacitor illustrated in FIG. 1.

As illustrated in FIGS. 1 and 3, the side surface 24c of the second electrode layer 24 has a tapered shape which is inclined inward from the first principal surface 24a on the dielectric film 23 side to the second principal surface 24b on the moisture resistant film 25 side.

The moisture resistant film 25 is provided in such a way as to cover the dielectric film 23 and the second electrode layer 24 at a portion except openings. Provision of the moisture resistant film 25 increases moisture resistance of the capacitor element, or of the dielectric film 23 in particular.

Although a material constituting the moisture resistant film 25 is not limited to a particular material, preferable examples thereof include a moisture resistant material such as $SiO_2$ and $SiN$.

The protecting layer 26 is provided with openings at a position overlapping the opening of the dielectric film 23 and the moisture resistant film 25 (the opening overlapping the first electrode layer 22) and at a position overlapping the opening of the moisture resistant film 25 (the opening overlapping the second electrode layer 24). Provision of the protecting layer 26 protects the capacitor element, or the dielectric film 23 in particular, against moisture.

Although a material constituting the protecting layer 26 is not limited to a particular material, preferable examples thereof include a resin material such as polyimide resin and a resin in a solder resist.

Although a material constituting the outer electrode 27 is not limited to a particular material, preferable examples thereof include Cu, Ni, Ag, Au, Al, and the like. The outer electrode 27 may have a single-layered structure or a multilayered structure. The outermost surface of the outer electrode 27 is preferably formed from Au or Sn.

In the case where the first outer electrode 27A has the multilayered structure, the first outer electrode 27A may include a seed layer 28a, a first plated layer 28b, and a second plated layer 28c, which are provided sequentially from the substrate 10 side as illustrated in FIG. 1.

Examples of the seed layer 28a of the first outer electrode 27A include a multilayer body (Ti/Cu) formed from a conductive layer made of titanium (Ti) and a conductive layer made of copper (Cu), and the like.

Examples of a material constituting the first plated layer 28b of the first outer electrode 27A include nickel (Ni) and the like.

Examples of a material constituting the second plated layer 28c of the first outer electrode 27A include gold (Au), tin (Sn), and the like.

In the case where the second outer electrode 27B has the multilayered structure, the second outer electrode 27B may include the seed layer 28a, the first plated layer 28b, and the second plated layer 28c, which are provided sequentially from the substrate 10 side as illustrated in FIG. 1.

Examples of the seed layer 28a of the second outer electrode 27B include the multilayer body (Ti/Cu) formed from the conductive layer made of titanium (Ti) and the conductive layer made of copper (Cu), and the like.

Examples of a constituting material of the first plated layer 28b of the second outer electrode 27B include nickel (Ni) and the like.

Examples of a constituting material of the second plated layer 28c of the second outer electrode 27B include gold (Au), tin (Sn), and the like.

The constituent materials of the first outer electrode 27A and the constituent materials of the second outer electrode 27B may be the same as or different from one another.

As illustrated in FIGS. 1 and 2, a first resin body 31 may be provided between the first outer electrode 27A and the second outer electrode 27B in plan view in the thickness direction T. The first resin body 31 is provided on a surface of the protecting layer 26, for example.

As illustrated in FIG. 1, a tip end of the first resin body 31 is preferably located at a position higher than tip ends of the first outer electrode 27A and the second outer electrode 27B in the thickness direction T. In this case, the first resin body 31 comes into contact with a wiring board side (such as an upper surface, a land, solder, and the like of the wiring board) earlier than the first outer electrode 27A and the second outer electrode 27B when mounting the capacitor 1 onto the wiring board. Accordingly, a load will be applied to the first resin body 31, thereby suppressing a load to be applied to the first outer electrode 27A and the second outer electrode 27B. As a consequence, the load is kept from being transmitted to the capacitor element via the first outer electrode 27A and the second outer electrode 27B, thus suppressing breakage of the capacitor element, or breakage of the dielectric film 23 in particular.

The first resin body 31 preferably includes at least one resin selected from the group consisting of the resin in the solder resist, polyimide resin, polyimideamide resin, and epoxy resin. The first resin body 31 is preferably a cured photosensitive resin.

The first resin body 31 may include a first wall portion 31a provided on the first outer electrode 27A side, and a second wall portion 31b provided on the second outer electrode 27B side and located away from the first wall portion 31a. The first wall portion 31a and the second wall portion 31b are preferably provided parallel to each other in plan view as illustrated in FIG. 2.

The first wall portion 31a may be provided with an opening which communicates with a space that separates the first wall portion 31a and the second wall portion 31b from each other. Likewise, the second wall portion 31b may be provided with an opening which communicates with the space that separates the first wall portion 31a and the second wall portion 31b from each other.

As illustrated in FIGS. 1 and 2, a second resin body 32 may be provided between the end portion of the substrate 10 and the first outer electrode 27A as well as between the end portion of the substrate 10 and the second outer electrode 27B in plan view in the thickness direction T. The second resin body 32 is provided on the surface of the protecting layer 26, for example. Alternatively, the second resin body 32 may be provided on the outside of the protecting layer 26. In this case, the second resin body 32 may be provided on the substrate 10.

As illustrated in FIG. 1, a tip end of the second resin body 32 is preferably located at a position higher than the tip ends of the first outer electrode 27A and the second outer electrode 27B in the thickness direction T. In this case, the second resin body 32 can disperse the load more widely when mounting the capacitor 1 onto the wiring board, for example. Accordingly, the load to be applied to the capacitor element, or to the dielectric film 23 in particular, can be sufficiently suppressed.

In addition, the tip end of the second resin body 32 is preferably located at a position lower than the tip end of the first resin body 31 in the thickness direction T as illustrated in FIG. 1. In this case, the first resin body 31 can stably hold the capacitor 1 on the wiring board when mounting the capacitor 1 onto the wiring board, for example.

The second resin body 32 preferably includes at least one resin selected from the group consisting of the resin in the solder resist, polyimide resin, polyimideamide resin, and epoxy resin. The second resin body 32 is preferably a cured photosensitive resin.

The resin included in the first resin body 31 and the resin included in the second resin body 32 may be the same as each other or different from each other.

As illustrated in FIG. 2, the second resin body 32 preferably includes a first outer peripheral portion 32a provided along the end portion of the substrate 10 and between the end portion of the substrate 10 and the first outer electrode 27A, and a second outer peripheral portion 32b provided along the end portion of the substrate 10 and between the end portion of the substrate 10 and the second outer electrode 27B, in plan view in the thickness direction T.

The first wall portion 31a is preferably connected to the first outer peripheral portion 32a. Meanwhile, the second wall portion 31b is preferably connected to the second outer peripheral portion 32b.

As mentioned above, the capacitor 1 illustrated in FIG. 1 is characterized in that the side surface 24c of the second electrode layer 24 has the tapered shape which is inclined inward from the first principal surface 24a to the second principal surface 24b.

As illustrated in FIG. 3, since the side surface 24c of the second electrode layer 24 has the above-mentioned tapered shape, it is possible to reduce a stress at a stress concentration point A on the moisture resistant film 25 provided at an end portion of the second electrode layer 24 when the load is applied to the outer electrode 27 (the second outer electrode 27B in particular). Thus, the stress on the moisture resistant film 25 can be relaxed, thereby reducing the stress to be applied to the dielectric film 23 provided below the moisture resistant film 25 and the second electrode layer 24. As a consequence, it is possible to suppress the occurrence of cracks at the dielectric film 23.

Figures 1, 4:
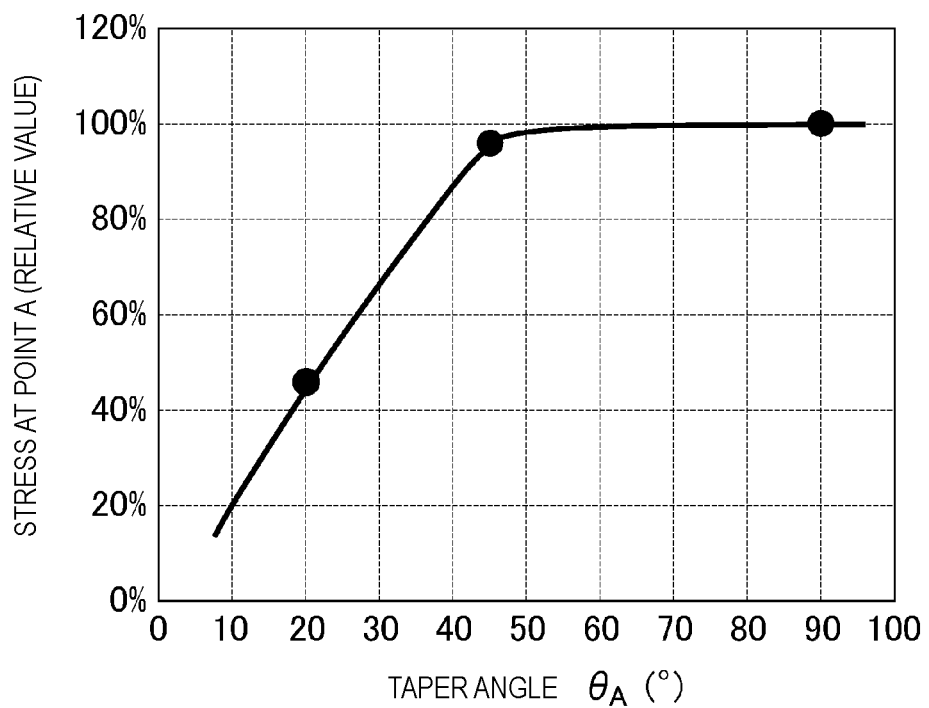
Figures 2, 4:
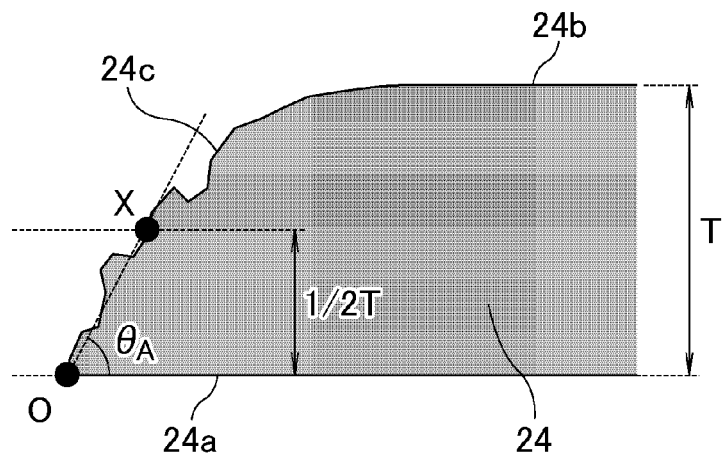

FIG. 4-1 is a graph plotting a relation between a taper angle $\theta_A$ and the stress at the point A. As illustrated in FIG. 3, the taper angle $\theta_A$ means an angle of the side surface 24c of the second electrode layer 24 with respect to the first principal surface 24a of the second electrode layer 24.

The stress at the point A was calculated by conducting simulation by using the finite element method. The taper angle $\theta$ A is equal to 90° when the side surface 24c of the second electrode layer 24 does not have a tapered shape. FIG. 4-1 plots relative values, which are standardized by defining the stress at the point A in this instance equal to 100%.

Viewing FIG. 4-1, it is possible to confirm that the magnitude of the stress at the point A being the stress concentration point on the moisture resistant film 25 becomes smaller as the taper angle $\theta$ A gets smaller than 90°.

In particular, a high effect to reduce the stress at the point A is available when the taper angle $\theta_A$ is less than or equal to 45°. While the effect to reduce the stress at the point A becomes higher as the taper angle $\theta_A$ gets smaller, the area of the second principal surface 24b relative to the first principal surface 24a of the second electrode layer 24 becomes smaller when the taper angle $\theta_A$ is less than 20°, which makes it difficult to secure a contact area with the second outer electrode 27B. Accordingly, when the angle of the side surface 24c of the second electrode layer 24 with respect to the first principal surface 24a of the second electrode layer 24 is defined as $\theta_A$, it is preferable to satisfy $20° \leq \theta_A \leq 45°$.

FIG. 4-2 is a schematic diagram for explaining a method of measuring the taper angle $\theta_A$.

As illustrated in FIG. 4-2, when a film thickness of the second electrode layer 24 is defined as T, a point of intersection of a line segment being parallel to the first principal surface 24a of the second electrode layer 24 and having a height of ½T and a line segment along the side surface 24c of the second electrode layer 24 will be defined as X. An angle formed between lines connecting the first principal surface 24a of the second electrode layer 24, a peak O, and the point X will be defined as the taper angle $\theta_A$. Note that taper angles $\theta_B$ and $\theta_C$ to be described later can also be measured in accordance with the same method.

The second electrode layer 24 is usually formed from one of the aforementioned metal elements and the like. In this case, a desired taper shape can be easily formed at the side surface 24c of the second electrode layer 24 by using a method such as wet etching and dry etching.

In the capacitor 1 illustrated in FIG. 1, the side surface 22c of the first electrode layer 22 does not have a tapered shape. In other words, an angle $\theta_B$ (see FIG. 7) of the side surface 22c of the first electrode layer 22 with respect to the first principal surface 22a of the first electrode layer 22 is equal to 90°. When the angle of the side surface 24c of the second electrode layer 24 with respect to the first principal surface 24a of the second electrode layer 24 is defined as $\theta_A$ and the angle of the side surface 22c of the first electrode layer 22 with respect to the first principal surface 22a of the first electrode layer 22 is defined as $\theta_B$ as described above, it is preferable to satisfy $\theta_A < \theta_B$.

Note that the tapered shape of the second electrode layer 24 may be formed at part of the side surface of the second electrode layer 24 or at the entirety thereof. Nonetheless, the load to be applied to the outer electrode 27 (the second outer electrode 27B in particular) is isotropically applied in a planar direction of the film such as the moisture resistant film 25. For this reason, the entire side surface of the second electrode layer 24 preferably has the tapered shape from the viewpoint of reducing the stress to be applied to the dielectric film 23.

As illustrated in FIGS. 1 and 2, an external shape of the second outer electrode 27B is preferably smaller than an external shape of the second electrode layer 24 in plan view in the thickness direction T. When the external shape of the second outer electrode 27B has the size greater than or equal to that of the external shape of the second electrode layer 24, the load to be applied to the outer electrode 27 (the second outer electrode 27B in particular) is more likely to be applied to the dielectric film 23. On the other hand, when the external shape of the second outer electrode 27B is smaller than the external shape of the second electrode layer 24, the load to be applied to the outer electrode 27 (the second outer electrode 27B in particular) is less likely to be applied to the dielectric film 23 since the second electrode layer 24 is present immediately below the second outer electrode 27B. As a consequence, it is possible to further suppress the occurrence of cracks at the dielectric film 23.

The capacitor 1 illustrated in FIG. 1 can be formed in accordance with a publicly known method as disclosed in International Publication WO 2019/021827, for example, except for providing the second electrode layer 24 with the tapered shape.

Second Embodiment

In a capacitor according to a second embodiment of the present invention, a second electrode layer is formed from multiple conductive layers so as to represent a modified example of the first embodiment.

Figure 5:
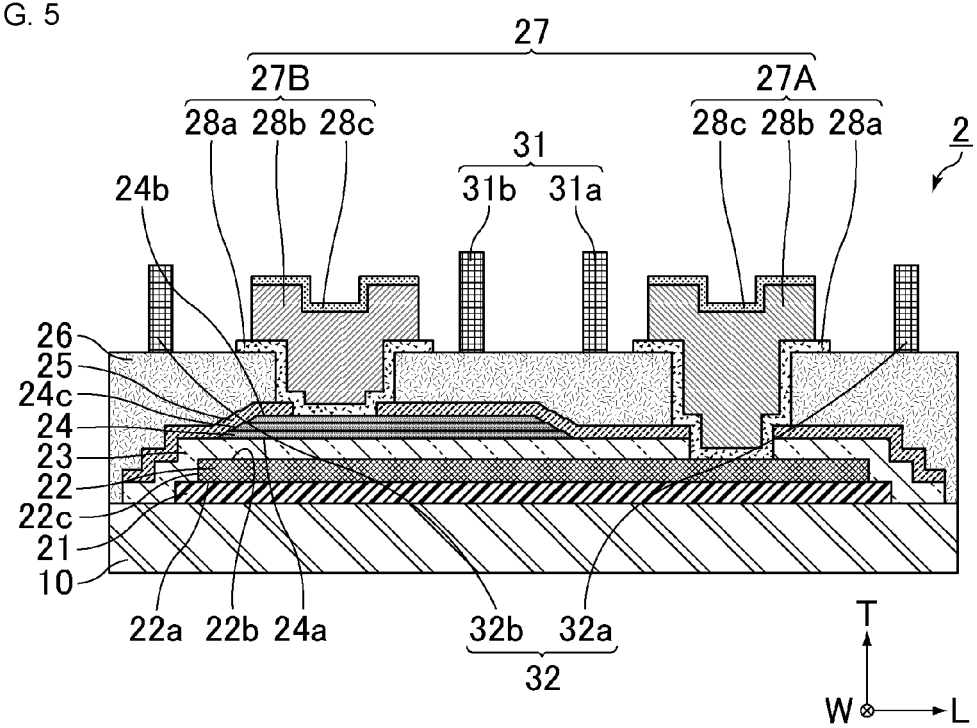
FIG. 5 is a cross-sectional view schematically illustrating an example of a capacitor according to a second embodiment of the present invention.

FIG. 5 is a cross-sectional view schematically illustrating an example of the capacitor according to the second embodiment of the present invention.

In a capacitor 2 illustrated in FIG. 5, the second electrode layer 24 is formed from multiple conductive layers laminated in a thickness direction (a direction indicated with an arrow T in FIG. 5). The number of the conductive layers is not limited to a particular number. A side surface of at least one of the conductive layers needs to have a tapered shape. Nonetheless, side surfaces of the respective conductive layers preferably have tapered shapes.

In the second electrode layer 24, a conductive layer located close to the moisture resistant film 25 out of the conductive layers being adjacent in the thickness direction T has a smaller area in plan view in the thickness direction T than an area of a conductive layer located close to the dielectric film 23. The taper angles of the respective conductive layers may be the same as or different from one another.

The capacitor 2 illustrated in FIG. 5 can achieve the same effects as those of the capacitor 1 illustrated in FIG. 1.

Third Embodiment

In a capacitor according to a third embodiment of the present invention, the tapered shape is provided not only to a side surface of a second electrode layer but also to a side surface of a first electrode layer so as to represent a modified example of the first embodiment and the second embodiment.

Figure 6:
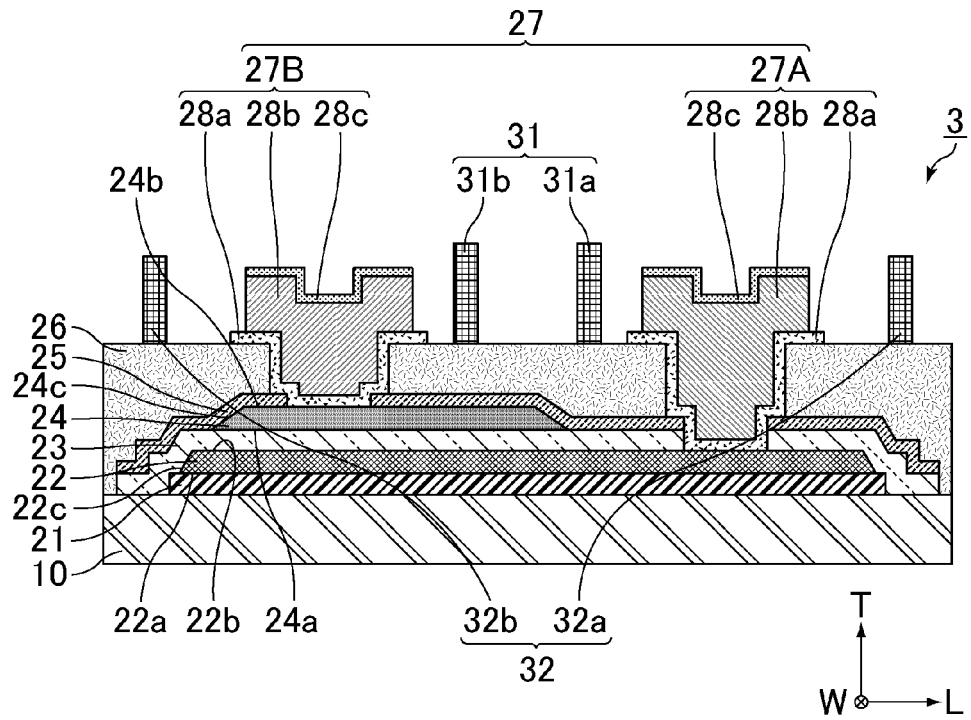
FIG. 6 is a cross-sectional view schematically illustrating an example of a capacitor according to a third embodiment of the present invention.
Figure 7:
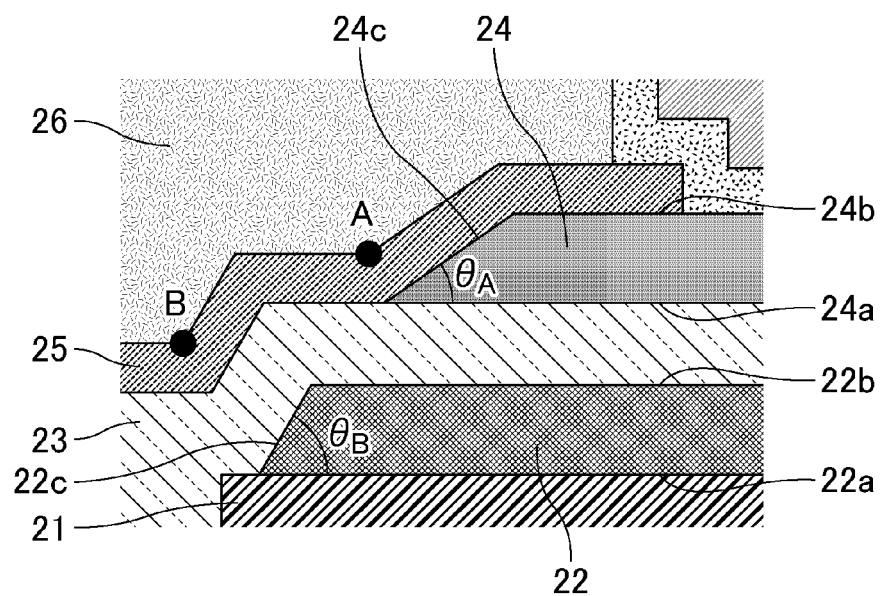
FIG. 7 is an enlarged cross-sectional view of side surfaces of a first electrode layer and a second electrode layer constituting the capacitor illustrated in FIG. 6.

FIG. 6 is a cross-sectional view schematically illustrating an example of the capacitor according to the third embodiment of the present invention. FIG. 7 is an enlarged cross-sectional view of side surfaces of the first electrode layer and the second electrode layer constituting the capacitor illustrated in FIG. 6.

In a capacitor 3 illustrated in FIG. 6, the side surface 22c of the first electrode layer 22 has a tapered shape which is inclined inward from the principal surface 22a to the second principal surface 22b. Moreover, as illustrated in FIG. 7, $\theta_A < \theta_B$ is satisfied when the angle of the side surface 24c of the second electrode layer 24 with respect to the first principal surface 24a of the second electrode layer 24 is defined as $\theta_A$ and the angle of the side surface 22c of the first electrode layer 22 with respect to the first principal surface 22a of the first electrode layer 22 is defined as $\theta_B$.

In the case where the side surface 24c of the second electrode layer 24 and the side surface 22c of the first electrode layer 22 have the tapered shapes as illustrated in FIG. 7, the stress at the stress concentration point A on the moisture resistant film 25 provided at the end portion of the second electrode layer 24 can be made smaller than a stress at a stress concentration point B on the moisture resistant film 25 along an end portion of the first electrode layer 22 by satisfying $\theta_A < \theta_B$. Thus, the stress to be applied to the dielectric film 23 provided below the moisture resistant film 25 and the second electrode layer 24 can be reduced relatively. As a consequence, it is possible to suppress the occurrence of cracks at the dielectric film 23.

When the angle of the side surface 24c of the second electrode layer 24 with respect to the first principal surface 24a of the second electrode layer 24 is defined as $\theta_A$, it is preferable to satisfy $20° \leq \theta_A \leq 45°$.

When the angle of the side surface 22c of the first electrode layer 22 with respect to the first principal surface 22a of the first electrode layer 22 is defined as $\theta_B$, it is preferable to satisfy $25° \leq \theta_B \leq 70°$.

Note that the tapered shape of the second electrode layer 24 may be formed at part of the side surface of the second electrode layer 24 or at the entirety thereof. Nonetheless, the entire side surface of the second electrode layer 24 preferably has the tapered shape. In the meantime, the tapered shape of the first electrode layer 22 may be formed at part of the side surface of the first electrode layer 22 or at the entirety thereof. Nonetheless, the entire side surface of the first electrode layer 22 preferably has the tapered shape.

Fourth Embodiment

A capacitor according to a fourth embodiment of the present invention further includes a third electrode layer provided on the dielectric film and located away from the second electrode layer. Here, the outer electrode includes a first outer electrode connected to the third electrode layer and a second outer electrode connected to the second electrode layer. In the capacitor according to the fourth embodiment of the present invention, the second electrode layer is formed from a single conductive layer.

Figure 8:
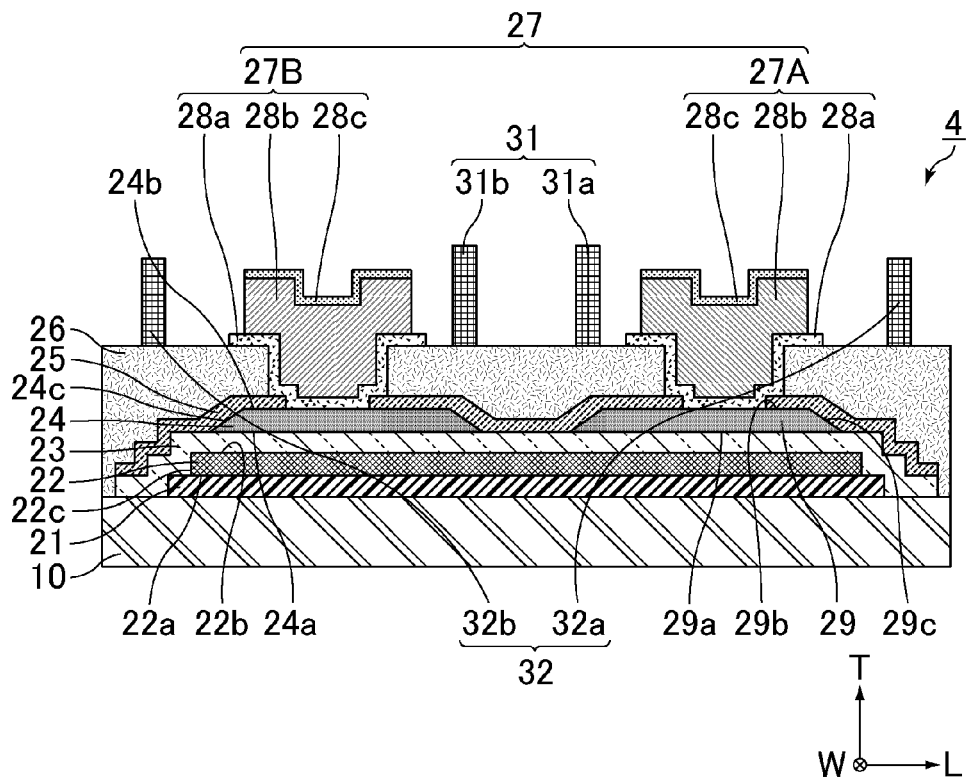
FIG. 8 is a cross-sectional view schematically illustrating an example of a capacitor according to a fourth embodiment of the present invention.

FIG. 8 is a cross-sectional view schematically illustrating an example of the capacitor according to the fourth embodiment of the present invention.

A capacitor 4 illustrated in FIG. 8 includes the substrate 10, the insulating film 21 provided on the substrate 10, the first electrode layer 22 provided on the insulating film 21, the dielectric film 23 provided on the first electrode layer 22, the second electrode layer 24 provided on the dielectric film 23, a third electrode layer 29 provided on the dielectric film 23 and located away from the second electrode layer 24, the moisture resistant film 25 provided on the dielectric film 23, on the second electrode layer 24, and on the third electrode layer 29, the protecting layer 26 provided on the moisture resistant film 25, and the outer electrode 27 penetrating the protecting layer 26. The outer electrode 27 includes the first outer electrode 27A connected to the third electrode layer 29 and the second outer electrode 27B connected to the second electrode layer 24. The first outer electrode 27A penetrates the protecting layer 26 and the moisture resistant film 25 while the second outer electrode 27B penetrates the protecting layer 26 and the moisture resistant film 25.

In the configuration of the capacitor 1 illustrated in FIG. 1, the capacitor is formed on the left side. On the other hand, in the configuration of the capacitor 4 illustrated in FIG. 8, the capacitors are formed on the right and left. In the configuration illustrated in FIG. 8, a portion in the configuration illustrated in FIG. 1 in which the first outer electrode 27A is connected to the first electrode layer 22 is just replaced with a structure provided with the first electrode layer 22, the dielectric film 23, and the third electrode layer 29 in this order. For this reason, the configuration illustrated in FIG. 8 does not have to secure a space to form an additional element as compared to the configuration illustrated in FIG. 1. Accordingly, it is possible to fabricate a capacitor having a low capacitance by using the same element area. The above-described configuration is effective in the case where it is not possible to form the dielectric film having a thickness at a certain level or larger.

The third electrode layer 29 is provided in such a way as to be opposed to the first electrode layer 22 with the dielectric film 23 interposed therebetween. The third electrode layer 29 includes a first principal surface 29a on the dielectric film 23 side, a second principal surface 29b on the moisture resistant film 25 side, and a side surface 29c which joins the first principal surface 29a and the second principal surface 29b.

The third electrode layer 29 has a structure formed from a single conductive layer.

Although a material constituting the third electrode layer 29 is not limited to a particular material, preferable examples thereof include Cu, Ag, Au, Al, Ni, Cr, Ti, an alloy containing at least one of these metal elements, and the like.

Figure 9:
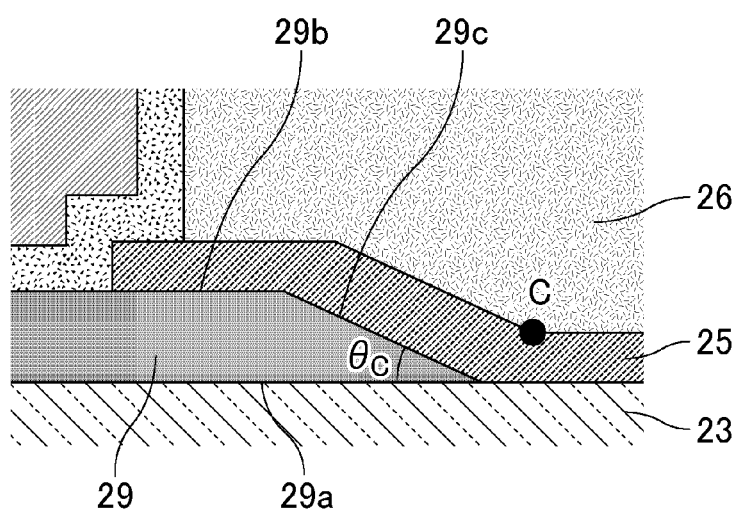
FIG. 9 is an enlarged cross-sectional view of a side surface of a third electrode layer constituting the capacitor illustrated in FIG. 8.

FIG. 9 is an enlarged cross-sectional view of the side surface of the third electrode layer constituting the capacitor illustrated in FIG. 8.

As illustrated in FIGS. 8 and 9, the side surface 29c of the third electrode layer 29 has a tapered shape which is inclined inward from the first principal surface 29a on the dielectric film 23 side to the second principal surface 29b on the moisture resistant film 25 side.

Since the side surface 29c of the third electrode layer 29 has the above-described tapered shape as illustrated in FIG. 9, it is possible to reduce a stress at a stress concentration point C on the moisture resistant film 25 provided at an end portion of the third electrode layer 29 when a load is applied to the outer electrode 27 (the first outer electrode 27A in particular). Thus, the stress on the moisture resistant film 25 can be relaxed so that the stress to be applied to the dielectric film 23 provided below the moisture resistant film 25 and the third electrode layer 29 can be reduced. As a consequence, it is possible to suppress the occurrence of cracks at the dielectric film 23.

Accordingly, the capacitor 4 illustrated in FIG. 8 can also achieve the same effects as those of the capacitor 1 illustrated in FIG. 1.

When the angle of the side surface 24c of the second electrode layer 24 with respect to the first principal surface 24a of the second electrode layer 24 is defined as OA, it is preferable to satisfy $20°≤θ_A≤45°$.

When an angle of the side surface 29c of the third electrode layer 29 with respect to the first principal surface 29a of the third electrode layer 29 is defined as OC, it is preferable to satisfy $20°≤θ_C≤45°$. The taper angle $θ_C$ of the third electrode layer 29 may be the same as or different from the taper angle $θ_A$ of the second electrode layer 24.

In the capacitor 4 illustrated in FIG. 8, the side surface 22c of the first electrode layer 22 does not have a tapered shape. In other words, the angle $θ_B$ (see FIG. 7) of the side surface 22c of the first electrode layer 22 with respect to the first principal surface 22a of the first electrode layer 22 is equal to 90°. When the angle of the side surface 24c of the second electrode layer 24 with respect to the first principal surface 24a of the second electrode layer 24 is defined as $θ_A$, the angle of the side surface 22c of the first electrode layer 22 with respect to the first principal surface 22a of the first electrode layer 22 is defined as $θ_B$, and the angle of the side surface 29c of the third electrode layer 29 with respect to the first principal surface 29a of the third electrode layer 29 is defined as $θ_C$ as described above, it is preferable to satisfy $θ_A<θ_B$ and $θ_C<θ_B$.

Note that the tapered shape of the second electrode layer 24 may be formed at part of the side surface of the second electrode layer 24 or at the entirety thereof. Nonetheless, the entire side surface of the second electrode layer 24 preferably has the tapered shape. Likewise, the tapered shape of the third electrode layer 29 may be formed at part of the side surface of the third electrode layer 29 or at the entirety thereof. Nonetheless, the entire side surface of the third electrode layer 29 preferably has the tapered shape.

As illustrated in FIG. 8, an external shape of the first outer electrode 27A is preferably smaller than an external shape of the third electrode layer 29 and the external shape of the second outer electrode 27B is preferably smaller than the external shape of the second electrode layer 24 in plan view in the thickness direction T. When the external shape of the first outer electrode 27A has the size greater than or equal to that of the external shape of the third electrode layer 29, the load to be applied to the outer electrode 27 (the first outer electrode 27A in particular) is more likely to be applied to the dielectric film 23. Meanwhile, when the external shape of the second outer electrode 27B has the size greater than or equal to that of the external shape of the second electrode layer 24, the load to be applied to the outer electrode 27 (the second outer electrode 27B in particular) is more likely to be applied to the dielectric film 23. On the other hand, when the external shape of the first outer electrode 27A is smaller than the external shape of the third electrode layer 29 and the external shape of the second outer electrode 27B is smaller than the external shape of the second electrode layer 24, the load to be applied to the outer electrode 27 (the first outer electrode 27A and the second outer electrode 27B) is less likely to be applied to the dielectric film 23 since the third electrode layer 29 is present immediately below the first outer electrode 27A and the second electrode layer 24 is present immediately below the second outer electrode 27B. As a consequence, it is possible to further suppress the occurrence of cracks at the dielectric film 23.

Fifth Embodiment

In a capacitor according to a fifth embodiment of the present invention, the second electrode layer is formed from multiple conductive layers and the third electrode layer is formed from multiple conductive layers so as to represent a modified example of the fourth embodiment.

Figure 10:
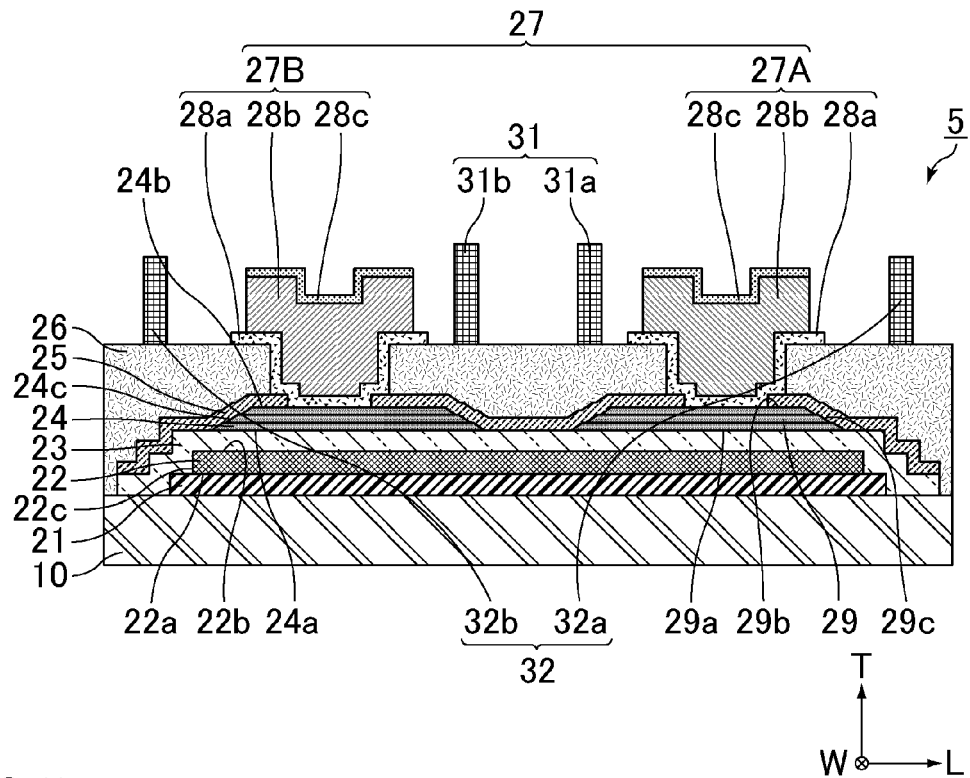
FIG. 10 is a cross-sectional view schematically illustrating an example of a capacitor according to a fifth embodiment of the present invention.

FIG. 10 is a cross-sectional view schematically illustrating an example of the capacitor according to the fifth embodiment of the present invention.

In a capacitor 5 illustrated in FIG. 10, the second electrode layer 24 is formed from multiple conductive layers laminated in a thickness direction (a direction indicated with an arrow T in FIG. 10). The number of the conductive layers is not limited to a particular number. A side surface of at least one of the conductive layers needs to have a tapered shape. Nonetheless, side surfaces of the respective conductive layers preferably have tapered shapes.

In the second electrode layer 24, a conductive layer located close to the moisture resistant film 25 out of the conductive layers being adjacent in the thickness direction T has a smaller area in plan view in the thickness direction T than an area of a conductive layer located close to the dielectric film 23. The taper angles of the respective conductive layers may be the same as or different from one another.

Likewise, the third electrode layer 29 is formed from multiple conductive layers laminated in the thickness direction T. The number of the conductive layers is not limited to a particular number. A side surface of at least one of the conductive layers needs to have a tapered shape. Nonetheless, side surfaces of the respective conductive layers preferably have tapered shapes. The number of the conductive layers included in the third electrode layer 29 may be the same as or different from the number of the conductive layers included in the second electrode layer 24.

In the third electrode layer 29, a conductive layer located close to the moisture resistant film 25 out of the conductive layers being adjacent in the thickness direction T has a smaller area in plan view in the thickness direction T than an area of a conductive layer located close to the dielectric film 23. The taper angles of the respective conductive layers may be the same as or different from one another.

The capacitor 5 illustrated in FIG. 10 can achieve the same effects as those of the capacitor 2 illustrated in FIG. 5.

Sixth Embodiment

In a capacitor according to a sixth embodiment of the present invention, a tapered shape is provided not only to a side surface of a second electrode layer but also to a side surface of a first electrode layer so as to represent a modified example of the fourth embodiment and the fifth embodiment.

Figure 11:
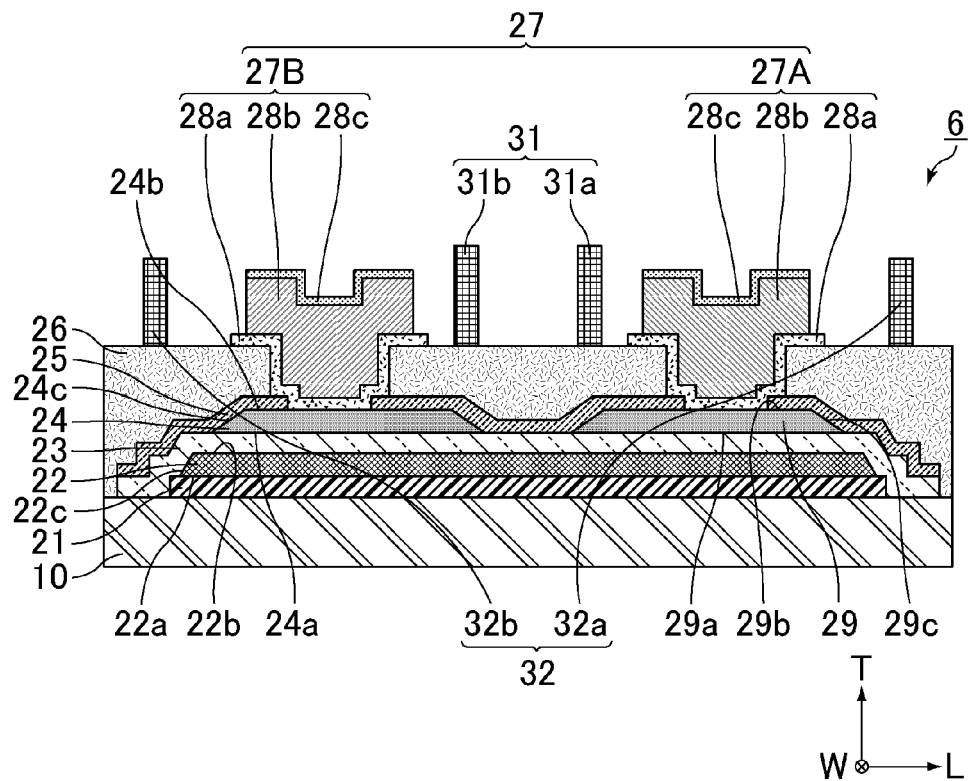
FIG. 11 is a cross-sectional view schematically illustrating an example of a capacitor according to a sixth embodiment of the present invention.

FIG. 11 is a cross-sectional view schematically illustrating an example of the capacitor according to the sixth embodiment of the present invention.

In a capacitor 6 illustrated in FIG. 11, the side surface 22c of the first electrode layer 22 has a tapered shape which is inclined inward from the first principal surface 22a to the second principal surface 22b. Moreover, $θ_A<θ_B$ and $θ_C<θ_B$ are satisfied when the angle of the side surface 24c of the second electrode layer 24 with respect to the first principal surface 24a of the second electrode layer 24 is defined as $\theta_A$, the angle of the side surface 22c of the first electrode layer 22 with respect to the first principal surface 22a of the first electrode layer 22 is defined as $\theta_B$, and the angle of the side surface 29c of the third electrode layer 29 with respect to the first principal surface 29a of the third electrode layer 29 is defined as $\theta_C$.

The capacitor 6 illustrated in FIG. 11 achieves the same effects as those of the capacitor 3 illustrated in FIG. 6.

When the angle of the side surface 24c of the second electrode layer 24 with respect to the first principal surface 24a of the second electrode layer 24 is defined as $\theta_A$, it is preferable to satisfy $20° \leq \theta_A \leq 45°$.

When the angle of the side surface 29c of the third electrode layer 29 with respect to the first principal surface 29a of the third electrode layer 29 is defined as $\theta_C$, it is preferable to satisfy $20° \leq \theta_C \leq 45°$. The taper angle $\theta_C$ of the third electrode layer 29 may be the same as or different from the taper angle $\theta_A$ of the second electrode layer 24.

When the angle of the side surface 22c of the first electrode layer 22 with respect to the first principal surface 22a of the first electrode layer 22 is defined as $\theta_B$, it is preferable to satisfy $25° \leq \theta_B \leq 70°$.

Note that the tapered shape of the second electrode layer 24 may be formed at part of the side surface of the second electrode layer 24 or at the entirety thereof. Nonetheless, the entire side surface of the second electrode layer 24 preferably has the tapered shape. Likewise, the tapered shape of the third electrode layer 29 may be formed at part of the side surface of the third electrode layer 29 or at the entirety thereof. Nonetheless, the entire side surface of the third electrode layer 29 preferably has the tapered shape. In the meantime, the tapered shape of the first electrode layer 22 may be formed at part of the side surface of the first electrode layer 22 or at the entirety thereof. Nonetheless, the entire side surface of the first electrode layer 22 preferably has the tapered shape.

OTHER EMBODIMENTS

The semiconductor device of the present invention is not limited to the above-described embodiments. Concerning the configurations, manufacturing conditions, and the like of the semiconductor device such as the capacitor, various applications and modifications can be added within the range of the present invention.

For example, the fifth embodiment of the present invention has described the capacitor in which the second electrode layer is formed from the multiple conductive layers and the third electrode layer is formed from the multiple conductive layers. Instead, the present invention may also include a capacitor in which one of the second electrode layer and the third electrode layer is formed from a single conductive layer and the other electrode layer is formed from multiple conductive layers.

REFERENCE SIGNS LIST 1, 2, 3, 4, 5, 6 capacitor (semiconductor device)
10 substrate
21 insulating film
22 first electrode layer
22a first principal surface of first electrode layer
22b second principal surface of first electrode layer
22c side surface of first electrode layer
23 dielectric film
24 second electrode layer
24a first principal surface of second electrode layer
24b second principal surface of second electrode layer
24c side surface of second electrode layer
25 moisture resistant film
26 protecting layer
27 outer electrode
27A first outer electrode
27B second outer electrode
28a seed layer
28b first plated layer
28c second plated layer
29 third electrode layer
29a first principal surface of third electrode layer
29b second principal surface of third electrode layer
29c side surface of third electrode layer
31 first resin body
31a first wall portion
31b second wall portion
32 second resin body
32a first outer peripheral portion
32b second outer peripheral portion
A, B, C stress concentration point on moisture resistant film
$\theta_A$ angle of side surface of second electrode layer with respect to first principal surface of second electrode layer
$\theta_B$ angle of side surface of first electrode layer with respect to first principal surface of first electrode layer
$\theta_C$ angle of side surface of third electrode layer with respect to first principal surface of third electrode layer

The invention claimed is:

1. A semiconductor device comprising:
a substrate;
a first electrode layer on the substrate, the first electrode layer including a first principal surface facing the substrate, a second principal surface opposite the first principal surface, and a first side surface joining the first principal surface and the second principal surface;
a dielectric film on the first electrode layer and covering an end portion of the first electrode layer;
a second electrode layer on the dielectric film, the second electrode layer including a third principal surface facing the dielectric film, a fourth principal surface opposite the third principal surface, and a second side surface joining the third principal surface and the fourth principal surface, wherein at least part of the second side surface of the second electrode layer has a first tapered shape which is inclined inward from the third principal surface to the fourth principal surface;
a moisture resistant film on the dielectric film and on the second electrode layer;
a protecting layer on the moisture resistant film; and
an outer electrode penetrating the protecting layer,
wherein the outer electrode is a first outer electrode connected to the first electrode layer; and
the semiconductor device includes a second outer electrode penetrating the protecting layer and connected to the second electrode layer, and
wherein, when a first angle of the second side surface of the second electrode layer with respect to the third principal surface of the second electrode layer is defined as OA and a second angle of the first side surface of the first electrode layer with respect to the first principal surface of the first electrode layer is defined as $\theta_B$, $\theta_A < \theta_B$.

2. The semiconductor device according to claim 1, wherein the second electrode layer comprises a single conductive layer.

3. The semiconductor device according to claim 1, wherein
the second electrode layer comprises a plurality of conductive layers laminated in a thickness direction of the semiconductor device, and
a first conductive layer proximal to the moisture resistant film among the plurality of conductive layers has a smaller area in a plan view in the thickness direction than an area of a second conductive layer proximal to the dielectric film among the plurality of conductive layers.

4. The semiconductor device according to claim 1, wherein at least part of the first side surface of the first electrode layer has a second tapered shape which is inclined inward from the first principal surface to the second principal surface.

5. The semiconductor device according to claim 1, wherein an external shape of the second outer electrode is smaller than an external shape of the second electrode layer in a plan view in the thickness direction.

6. The semiconductor device according to claim 1, further comprising:
a third electrode layer on the dielectric film and spaced from the second electrode layer, the third electrode layer including a fifth principal surface facing the dielectric film, a sixth principal surface opposite the fifth principal surface, and a third side surface joining the fifth principal surface and the sixth principal surface, wherein at least part of the third side surface of the third electrode layer has a second tapered shape which is inclined inward from the first principal surface to the second principal surface.

7. The semiconductor device according to claim 6, wherein, when a third angle of the third side surface of the third electrode layer with respect to the fifth principal surface of the third electrode layer is defined as $\theta_C$, $\theta_C < \theta_B$.

8. The semiconductor device according to claim 6, wherein
the second electrode layer comprises a single conductive layer having the first tapered shape, and
the third electrode layer comprises a single conductive layer having the second tapered shape.

9. The semiconductor device according to claim 8, wherein, when a third angle of the third side surface of the third electrode layer with respect to the fifth principal surface of the third electrode layer is defined as $\theta_C$, $\theta_C < \theta_B$.

10. The semiconductor device according to claim 6, wherein
the second electrode layer comprises a first plurality of conductive layers laminated in the thickness direction and each having the first tapered shape,
the third electrode layer comprises a second plurality of conductive layers laminated in the thickness direction and each having the second tapered shape,
a first conductive layer proximal to the moisture resistant film among the first plurality of conductive layers has a smaller area in a plan view in the thickness direction than an area of a second conductive layer proximal to the dielectric film among the first plurality of conductive layers, and
a third conductive layer proximal to the moisture resistant film among the second plurality of conductive layers has a smaller area in the plan view in the thickness direction than an area of a fourth conductive layer proximal to the dielectric film among the second plurality of conductive layers.

11. The semiconductor device according to claim 10, wherein, when a third angle of the third side surface of the third electrode layer with respect to the fifth principal surface of the third electrode layer is defined as $\theta_C$, $\theta_C < \theta_B$.

12. The semiconductor device according to claim 6, wherein an external shape of the first outer electrode is smaller than an external shape of the third electrode layer and an external shape of the second outer electrode is smaller than an external shape of the second electrode layer in a plan view in the thickness direction.

13. The semiconductor device according to claim 1, wherein $20° \leq \theta_A \leq 45°$.

14. The semiconductor device according to claim 6, wherein,
$20° \leq \theta_A \leq 45°$, and
$20° \leq \theta_C \leq 45°$.

15. A semiconductor device comprising:
a substrate;
a first electrode layer on the substrate, the first electrode layer including a first principal surface facing the substrate, a second principal surface opposite the first principal surface, and a first side surface joining the first principal surface and the second principal surface;
a dielectric film on the first electrode layer and covering an end portion of the first electrode layer;
a second electrode layer on the dielectric film, the second electrode layer including a third principal surface facing the dielectric film, a fourth principal surface opposite the third principal surface, and a second side surface joining the third principal surface and the fourth principal surface, wherein at least part of the second side surface of the second electrode layer has a first tapered shape which is inclined inward from the third principal surface to the fourth principal surface;
a moisture resistant film on the dielectric film and on the second electrode layer;
a protecting layer on the moisture resistant film;
an outer electrode penetrating the protecting layer; and
a third electrode layer on the dielectric film and spaced from the second electrode layer, the third electrode layer including a fifth principal surface facing the dielectric film, a sixth principal surface opposite the fifth principal surface, and a third side surface joining the fifth principal surface and the sixth principal surface, wherein at least part of the third side surface of the third electrode layer has a second tapered shape which is inclined inward from the first principal surface to the second principal surface,
wherein
the outer electrode is a first outer electrode connected to the third electrode layer,
the semiconductor device includes a second outer electrode penetrating the protecting layer and connected to the second electrode layer,
the second electrode layer comprises a first plurality of conductive layers laminated in the thickness direction and each having the first tapered shape,
the third electrode layer comprises a second plurality of conductive layers laminated in the thickness direction and each having the second tapered shape,
a first conductive layer proximal to the moisture resistant film among the first plurality of conductive layers has a smaller area in a plan view in the thickness direction than an area of a second conductive layer proximal to the dielectric film among the first plurality of conductive layers, a third conductive layer proximal to the moisture resistant film among the second plurality of conductive layers has a smaller area in the plan view in the thickness direction than an area of a fourth conductive layer proximal to the dielectric film among the second plurality of conductive layers, when a first angle of the second side surface of the second electrode layer with respect to the third principal surface of the second electrode layer is defined as $\theta_A$, a second angle of the first side surface of the first electrode layer with respect to the first principal surface of the first electrode layer is defined as OB, and a third angle of the third side surface of the third electrode layer with respect to the fifth principal surface of the third electrode layer is defined as $\theta_C$, $\theta_A < \theta_B$ and $\theta_C < \theta_B$, and at least part of the first side surface of the first electrode layer has a third tapered shape which is inclined inward from the first principal surface to the second principal surface.

\* \* \* \* \*